(12) United States Patent
Kaneko et al.

(10) Patent No.: US 11,189,481 B2
(45) Date of Patent: Nov. 30, 2021

(54) SUBSTRATE PROCESSING APPARATUS AND SUBSTRATE PROCESSING METHOD

(71) Applicant: Tokyo Electron Limited, Tokyo (JP)

(72) Inventors: Tomohiro Kaneko, Koshi (JP); Shuhei Goto, Koshi (JP)

(73) Assignee: TOKYO ELECTRON LIMITED, Tokyo (JP)

(*) Notice: Subject to any disclaimer, the term of this patent is extended or adjusted under 35 U.S.C. 154(b) by 0 days.

(21) Appl. No.: 16/448,142

(22) Filed: Jun. 21, 2019

(65) Prior Publication Data

US 2019/0393028 A1 Dec. 26, 2019

(30) Foreign Application Priority Data

Jun. 25, 2018 (JP) .............................. JP2018-119628

(51) Int. Cl.
| | | |
|---|---|---|
| *H01L 21/67* | (2006.01) | |
| *H01L 21/677* | (2006.01) | |
| *H01L 21/02* | (2006.01) | |
| *B08B 7/00* | (2006.01) | |
| *G05B 19/418* | (2006.01) | |

(52) U.S. Cl.
CPC ...... *H01L 21/02101* (2013.01); *B08B 7/0021* (2013.01); *G05B 19/4189* (2013.01); *H01L 21/67034* (2013.01); *H01L 21/67051* (2013.01); *H01L 21/67173* (2013.01);
(Continued)

(58) Field of Classification Search
CPC ......... H01L 21/67051; H01L 21/67034; H01L 21/67742; H01L 21/67207; H01L 21/67173; H01L 21/67028; H01L 21/67745; H01L 21/67276; H01L 21/67739; H01L 21/67155; H01L 21/6704; G05B 19/4189; G05B 19/41865;
(Continued)

(56) References Cited

U.S. PATENT DOCUMENTS 5,801,945 A * 9/1998 Comer ............. G05B 19/41865
700/100
2005/0282371 A1 * 12/2005 Patton ...................... C25D 5/10
438/597
(Continued)

FOREIGN PATENT DOCUMENTS

JP 2013-012538 A 1/2013

*Primary Examiner* — Natasha N Campbell
(74) *Attorney, Agent, or Firm* — Pearne & Gordon LLP

(57) ABSTRACT

A substrate processing apparatus includes first processors, second processors, a transfer module and a controller. Each of the first processors is configured to perform a first processing on a substrate. Each of the second processors is configured to perform a second processing on the substrate on which the first processing is performed. The transfer module is configured to transfer the substrate to the first processors and the second processors. The controller is configured to control the first processors, the second processors and the transfer module. The controller controls a start timing for a first transfer processing of transferring the substrates to the first processor such that a timing of a second transfer processing of transferring the substrate having a liquid film formed thereon to the second processor from the first processor and a timing when another substrate is transferred by the transfer module are not overlapped with each other.

8 Claims, 14 Drawing Sheets

(52) U.S. Cl.
CPC .. *H01L 21/67207* (2013.01); *H01L 21/67742* (2013.01); *G05B 2219/45031* (2013.01)

(58) Field of Classification Search
CPC ........... G05B 2219/45031; G05B 2219/32265; Y02P 90/02
See application file for complete search history.

(56) References Cited

U.S. PATENT DOCUMENTS

2006/0182533 A1* 8/2006 Ogi ................... H01L 21/67196
  414/217
2014/0083468 A1* 3/2014 Miyazaki .......... H01L 21/67051
  134/82

\* cited by examiner

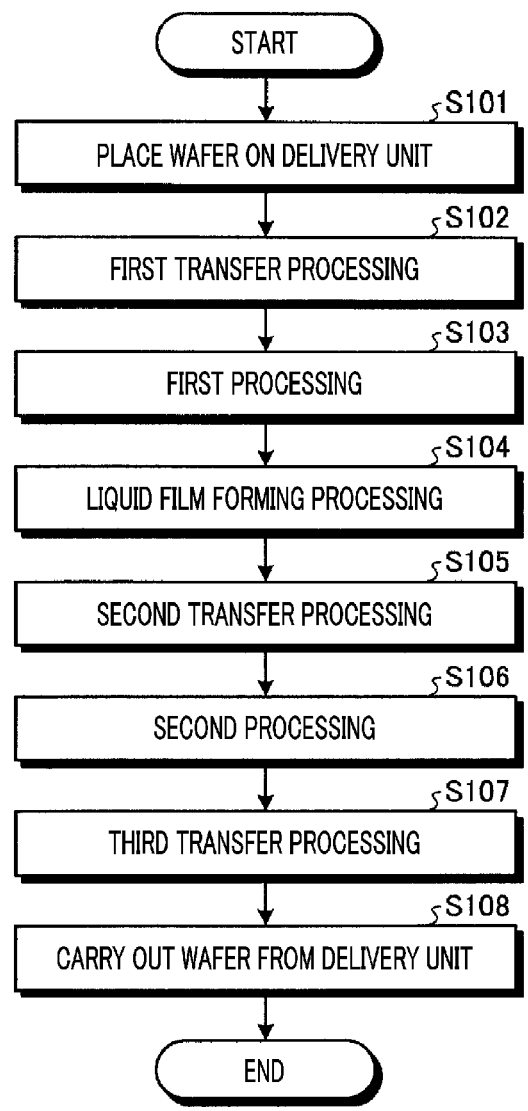

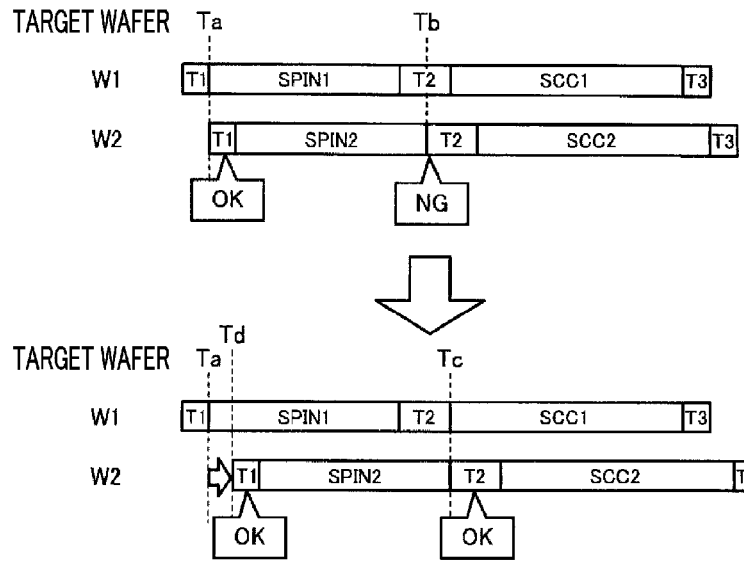
FIG. 6A
FIG. 6B
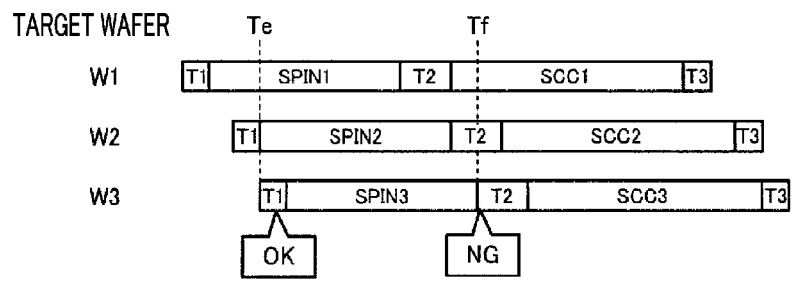
FIG. 7A
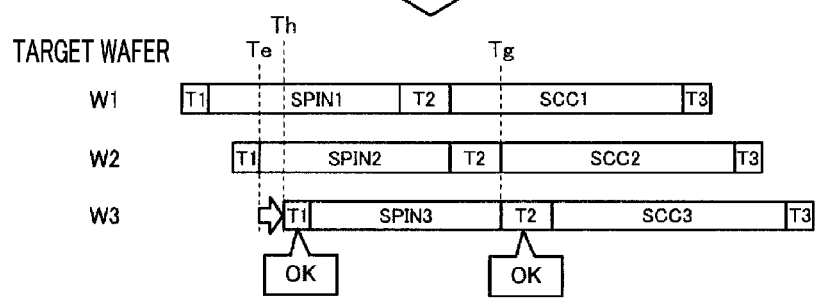
FIG. 7B

SUBSTRATE PROCESSING APPARATUS AND SUBSTRATE PROCESSING METHOD

CROSS-REFERENCE TO RELATED APPLICATION

This application claims the benefit of Japanese Patent Application No. 2018-119628 filed on Jun. 25, 2018, the entire disclosures of which are incorporated herein by reference.

TECHNICAL FIELD

The various aspects and embodiments described herein pertain generally to a substrate processing apparatus and a substrate processing method.

BACKGROUND

Conventionally, there is known a substrate processing apparatus configured to form a liquid film for dry prevention on a surface of a semiconductor wafer (hereinafter, simply referred to as "wafer") as a substrate and configured to perform a drying processing by bringing the wafer having the liquid film formed thereon into contact with a processing fluid in a supercritical state (see, for example, Patent Document 1).

Patent Document 1: Japanese Patent Laid-open Publication No. 2013-012538

SUMMARY

In one exemplary embodiment, a substrate processing apparatus includes multiple first processors, multiple second processors, a transfer module and a controller. Each of the multiple first processors is configured to perform a first processing on a substrate. Each of the multiple second processors is configured to perform a second processing on the substrate on which the first processing is performed. The transfer module is configured to transfer the substrate to the multiple first processors and the multiple second processors. The controller is configured to control the multiple first processors, the multiple second processors and the transfer module. The controller controls a start timing for a first transfer processing of transferring the substrates to the first processor such that a timing of a second transfer processing of transferring the substrate having a liquid film formed thereon through the first processing to the second processor from the first processor and a timing when another substrate is transferred by the transfer module are not overlapped with each other.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

FIG. 5 is a flowchart showing a sequence of a series of substrate processings performed in the substrate processing system according to the exemplary embodiment;

FIG. 6A and FIG. 6B are timing charts (1) for describing a start timing setting processing for a first transfer processing according to the exemplary embodiment;

FIG. 7A and FIG. 7B are timing charts (2) for describing the start timing setting processing for the first transfer processing according to the exemplary embodiment;

DETAILED DESCRIPTION

Figure 1:
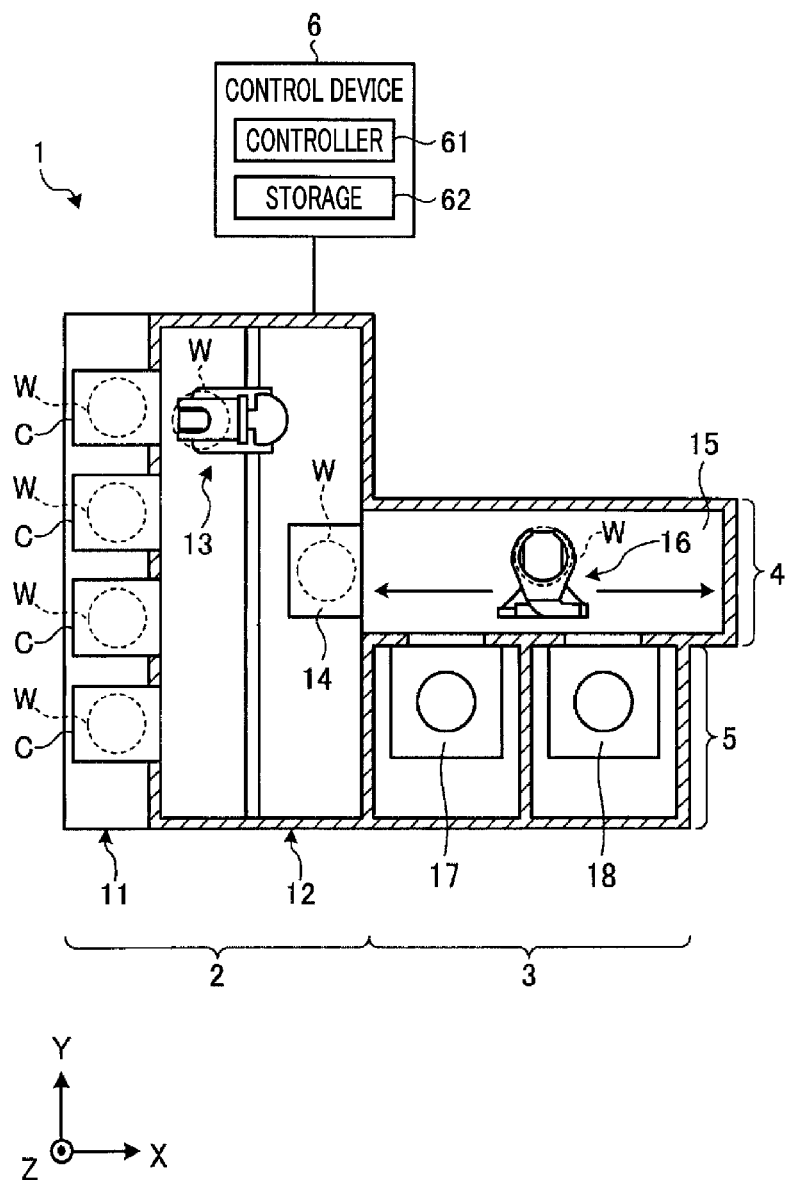
FIG. 1 is a schematic cross sectional top view of a substrate processing system according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, exemplary embodiments of a substrate processing apparatus and a substrate processing method according to the present disclosure will be described in detail with reference to the accompanying drawings. However, the present disclosure is not limited to the following exemplary embodiments. Further, it should be noted that the drawings are schematic and relations in sizes of individual components and ratios of the individual components may sometimes be different from actual values. Even between the drawings, there may exist parts having different dimensional relationships or different ratios.

Conventionally, there is known a substrate processing apparatus configured to form a liquid film for dry prevention on a surface of a semiconductor wafer (hereinafter, simply referred to as "wafer") as a substrate and configured to perform a drying processing by bringing this wafer having the liquid film formed thereon into contact with a processing fluid in a supercritical state.

If, however, another wafer is transferred at a timing when the wafer having the liquid film formed on a surface thereof is transferred into a subsequent drying unit, the wafer having the liquid film formed thereon is required to stand by until the transfer of the another wafer is completed.

If a state of the liquid film on the surface of the wafer is changed as the liquid film is dried or the like during the stand-by, a problem such as a collapse of a pattern formed on the wafer may occur in a subsequent drying processing, which results in a decrease of a yield of wafers.

In this regard, when transferring the wafer having the liquid film formed on the surface thereof, it is required to suppress non-uniformity in a transfer time.

<Configuration of Substrate Processing System>

Figure 2:
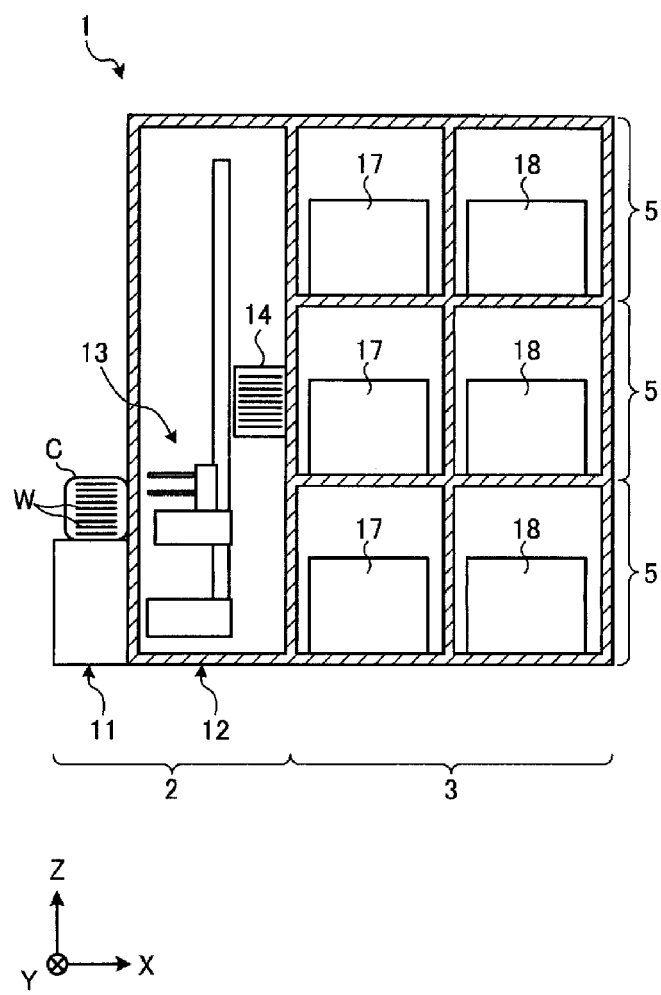
FIG. 2 is a schematic cross sectional side view of the substrate processing system according to the exemplary embodiment.

First, a configuration of a substrate processing system 1 (an example of a substrate processing apparatus) according to an exemplary embodiment will be explained with reference to FIG. 1 and FIG. 2. FIG. 1 is a schematic cross sectional view illustrating the substrate processing system 1 according to the exemplary embodiment seen from above. FIG. 2 is a schematic cross sectional view illustrating the substrate processing system 1 according to the exemplary embodiment when viewed from the lateral side thereof. Further, in the following description, in order to clarify positional relationships, X-axis, Y-axis and Z-axis which are orthogonal to each other will be defined. The positive Z-axis direction will be regarded as a vertically upward direction.

As illustrated in FIG. 1, the substrate processing system 1 includes a carry-in/out station 2 and a processing station 3. The carry-in/out station 2 and the processing station 3 are provided adjacent to each other.

The carry-in/out station 2 is provided with a carrier placing section 11 and a transfer section 12. In the carrier placing section 11, carriers C each accommodating semiconductor wafers W (hereinafter, referred to as "wafers W") horizontally is placed.

The transfer section 12 is provided adjacent to the carrier placing section 11, and provided with a transfer device 13 and a delivery unit 14.

The transfer device 13 is provided with a wafer holding mechanism configured to hold the wafer W. Further, the transfer device 13 is movable horizontally and vertically, and pivotable around a vertical axis, and transfers the wafer W between the carrier C and the delivery unit 14 by using the wafer holding mechanism.

The processing station 3 is provided adjacent to the transfer section 12. The processing station 3 is provided with a transfer block 4 and a plurality of processing blocks 5.

The transfer block 4 is provided with a transfer area 15 and a transfer device 16. The transfer area 15 is, for example, a rectangular parallelepiped region extended along an arrangement direction of the carry-in/out station 2 and the processing station 3 (X-axis direction). The transfer device 16 is disposed in the transfer area 15.

The transfer device 16 is provided with a wafer holding mechanism configured to hold the wafer W. Further, the transfer device 16 is movable horizontally and vertically and pivotable around a vertical axis. The transfer device 16 transfers the wafer W between the delivery unit 14 and the processing block 5 by using the wafer holding mechanism.

The processing blocks 5 are disposed at one side of the transfer area 15 to be adjacent to the transfer area 15. To elaborate, the processing blocks 5 are disposed at one side (negative Y-axis side in the drawing) of the transfer area 15 in a direction (Y-axis direction) orthogonal to the arrangement direction (X-axis direction) of the carry-in/out station 2 and the processing station 3.

Further, as depicted in FIG. 2, the processing blocks 5 are disposed in multiple levels along the vertical direction. In the present exemplary embodiment, three levels of the processing blocks 5 are provided. However, the number of the levels of the processing blocks 5 is not limited to three.

As stated above, in the substrate processing system 1 according to the exemplary embodiment, the processing blocks 5 are arranged in the multiple levels at one side of the transfer block 4. The transfer of the wafer W between the processing block 5 in each level and the delivery unit 14 is performed by the common transfer device 16 provided in the transfer block 4.

Each processing block 5 is equipped with a liquid processing unit 17 and a drying unit 18. The liquid processing unit 17 is an example of a first processor, and the drying unit 18 is an example of a second processor.

The liquid processing unit 17 is configured to perform a cleaning processing of cleaning a top surface, that is, a pattern formation surface of the wafer W. This cleaning processing is an example of a first processing. Although the following exemplary embodiment is described for an example where the cleaning processing is performed as the first processing, the first processing is not limited to the cleaning processing.

Further, the liquid processing unit 17 is configured to perform a liquid film forming processing of forming a liquid film on the top surface of the wafer W after being subjected to the cleaning processing. A configuration of the liquid processing unit 17 will be discussed later.

The drying unit 18 is configured to perform a supercritical drying processing on the wafer W after being subjected to the liquid film forming processing. To elaborate, the drying unit 18 is configured to dry the wafer W after being subjected to the liquid film forming processing by bringing this wafer W into contact with a processing fluid in a supercritical state (hereinafter, sometimes referred to as "supercritical fluid"). This supercritical drying processing is an example of a second processing.

Further, although the following exemplary embodiment is described for an example where the supercritical drying processing is performed as the second processing, such a second processing is not limited to the supercritical drying processing, and may be another type of drying processing such as a spin drying processing. Further, the second processing is not limited to the drying processing, and may be a liquid processing or the like. A configuration of the drying unit 18 will be discussed later.

Further, though not illustrated in FIG. 1 and FIG. 2, the substrate processing system 1 is equipped with a supply unit configured to supply the processing fluid to the drying unit 18. To be specific, such a supply unit is equipped with: a supply device group including a flowmeter, a flow rate controller, a back pressure valve, a heater and so forth; and a housing accommodating the supply device group therein. In the present exemplary embodiment, the supply unit supplies $CO_2$ to the drying unit 18 as the processing fluid.

The liquid processing unit 17 and the drying unit 18 are arranged along the transfer area 15 (that is, in the X-axis direction). In the liquid processing unit 17 and the drying unit 18, the liquid processing unit 17 is placed at a position close to the carry-in/out station 2 and the drying unit 18 is placed at a position far from the carry-in/out station 2.

As stated above, each processing block 5 includes one liquid processing unit 17 and one drying unit 18. That is, the same number of liquid processing units 17 and drying units 18 are provided in the substrate processing system 1.

As depicted in FIG. 1, the substrate processing system 1 is equipped with a control device 6. The control device 6 is, for example, a computer, and includes a controller 61 and a storage 62.

The controller 61 includes: a microcomputer having a CPU (Central Processing Unit), a ROM (Read Only Memory), a RAM (Random Access Memory), an input/output port, and so forth; and various kinds of circuits. The CPU of such a microcomputer reads out and executes a program stored in the ROM, thus implementing controls over the transfer devices 13 and 16, the liquid processing unit 17, the drying unit 18, and so forth.

Further, this program is stored in a computer-readable recording medium and may be installed to the storage 62 of the control device 6 from this recording medium. The computer-readable recording medium may be, by way of non-limiting example, a hard disk (HD), a flexible disk (FD), a compact disk (CD), a magnet optical disk (MO), a memory card, or the like.

The storage 62 may be, by way of example, but not limitation, a semiconductor memory device such as a RAM or a flash memory, or a storage device such as a hard disk or an optical disk.

<Configuration of Liquid Processing Unit>

Figure 3:
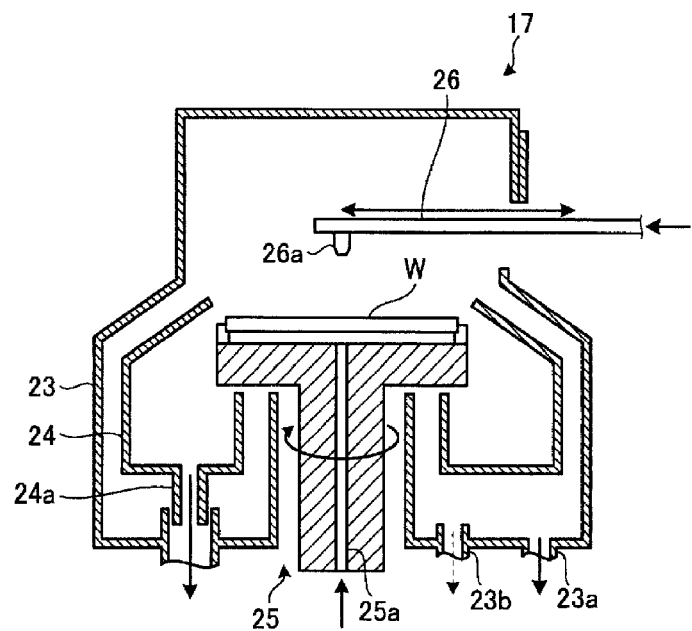
FIG. 3 is a diagram illustrating a configuration example of a liquid processing unit.

Now, the configuration of the liquid processing unit 17 will be described with reference to FIG. 3. FIG. 3 is a diagram illustrating a configuration example of the liquid processing unit 17. The liquid processing unit 17 is configured as a single-wafer cleaning apparatus configured to clean the wafers W one by one by, for example, spin cleaning.

As depicted in FIG. 3, the liquid processing unit 17 holds the wafer W substantially horizontally with a wafer holding mechanism 25 provided within an outer chamber 23 forming a processing space therein and rotates the wafer W by revolving this wafer holding mechanism 25 around a vertical axis.

Further, in the liquid processing unit 17, a nozzle arm 26 is advanced to a space above the wafer W being rotated, and by supplying a chemical liquid or a rinse liquid in a preset sequence from a chemical liquid nozzle 26a provided at a leading end of the nozzle arm 26, the cleaning processing on the top surface of the wafer W is performed.

Furthermore, in the liquid processing unit 17, a chemical liquid supply path 25a is formed within the wafer holding mechanism 25. A bottom surface of the wafer W is also cleaned by the chemical liquid or the rinse liquid supplied form this chemical liquid supply path 25a.

In the cleaning processing, a particle and an organic contaminant are removed by, for example, SC1 solution (a mixed solution of ammonia and oxygenated water) as an alkaline chemical liquid. Then, the rinse cleaning is performed by using deionized water (hereinafter, referred to as "DIW") as the rinse liquid.

Subsequently, a natural oxide film is removed by diluted hydrofluoric acid (hereinafter, referred to as "DHF") as an acidic chemical liquid and the rinse cleaning by the DIW is performed.

The aforementioned various kinds of chemical liquids are received by the outer chamber 23 or an inner cup 24 disposed within the outer chamber 23, and then, drained from a drain port 23a provided at a bottom of the outer chamber 23 or a drain port 24a provided at a bottom of the inner cup 24. Further, an atmosphere within the outer chamber 23 is exhausted through an exhaust port 23b provided at the bottom of the outer chamber 23.

A liquid film forming processing is performed after the rinsing processing in the cleaning processing. To elaborate, the liquid processing unit 17 supplies IPA in a liquid state (hereinafter, sometimes referred to as "IPA liquid") to the top surface and the bottom surface of the wafer W while rotating the wafer holding mechanism 25. Accordingly, the DIW remaining on both the top and bottom surfaces of the wafer W is replaced by the IPA. Thereafter, the liquid processing unit 17 stops the rotation of the wafer holding mechanism 25 gently.

The wafer W after being subjected to the liquid film forming processing is delivered, while having a liquid film of the IPA liquid formed on the top surface thereof, to the transfer device 16 by a non-illustrated delivery mechanism provided in the wafer holding mechanism 25, and then, is taken out of the liquid processing unit 17.

The liquid film formed on the wafer W suppresses the liquid on the top surface of the wafer W from evaporating (vaporizing) and thus causing a pattern collapse during the transfer of the wafer W into the drying unit 18 from the liquid processing unit 17 and during the transfer operation of the wafer W into the drying unit 18.

<Outline of Drying Unit>

Figure 4:
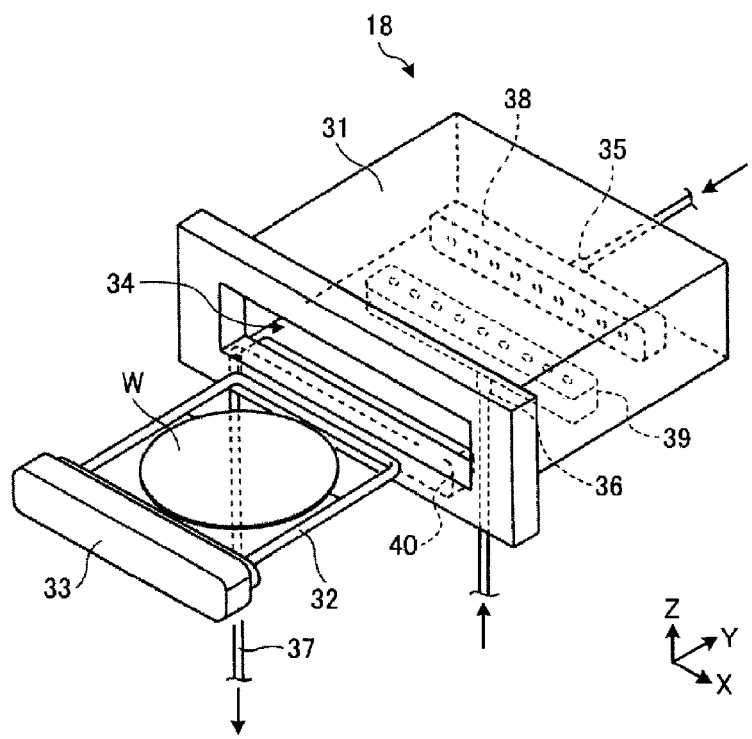
FIG. 4 is a schematic perspective view illustrating a configuration example of a drying unit.

Now, the configuration of the drying unit 18 will be described with reference to FIG. 4. FIG. 4 is a schematic perspective view illustrating a configuration example of the drying unit 18.

The drying unit 18 includes a main body 31, a holding plate 32 and a lid member 33. The main body 31 of a housing shape is provided with an opening 34 through which the wafer W is carried in and out. The holding plate 32 is configured to hold the wafer W as a processing target in the horizontal direction. The lid member 33 is configured to support the holding plate 32 and seal the opening 34 when the wafer W is carried into the main body 31.

The main body 31 is a vessel having therein a processing space capable of accommodating the wafer W having a diameter of, e.g., 300 mm. Supply ports 35 and 36 and a drain port 37 are provided at walls of the main body 31. The supply ports 35 and 36 and the drain port 37 are respectively connected to supply paths and a drain path through which the supercritical fluid is circulated into the drying unit 18.

The supply port 35 is connected to a side surface of the housing-shaped main body 31 opposite to a side surface where the opening 34 is provided. Further, the supply port 36 is connected to a bottom surface of the main body 31. The drain port 37 is connected to a portion of the main body 31 under the opening 34. Here, although the two supply ports 35 and 36 and the single drain port 37 are illustrated in FIG. 4, the numbers of the supply ports 35 and 36 and the drain port 37 are not particularly limited.

Further, fluid supply headers 38 and 39 and a fluid drain header 40 are provided within the main body 31. Each of the fluid supply headers 38 and 39 is provided with a multiple number of supply openings arranged in a lengthwise direction thereof, and the fluid drain header 40 is provided with a multiple number of drain openings arranged in a lengthwise direction thereof.

The fluid supply header 38 is connected to the supply port 35. Within the housing-shaped main body 31, the fluid supply header 38 is provided adjacent to the side surface of the main body 31 opposite to the opening 34. Further, the multiple number of supply openings arranged at the fluid supply header 38 are directed toward the opening 34 side.

The fluid supply header 39 is connected to the supply port 36. Within the housing-shaped main body 31, the fluid supply header 39 is provided at a central portion of the bottom surface of the housing-shaped main body 31. The multiple number of supply openings arranged at the fluid supply header 39 face upwards.

The fluid drain header 40 is connected to the drain port 37. Within the housing-shaped main body 31, the fluid drain header 40 is provided adjacent to the side surface of the main body 31 near the opening 34 and is positioned under the opening 34. The multiple number of drain openings at the fluid drain header 40 face upwards.

The fluid supply headers 38 and 39 supply the supercritical fluid into the main body 31. Further, the fluid drain header 40 guides and drains the supercritical fluid within the main body 31 to the outside thereof. Further, the supercritical fluid drained to the outside of the main body 31 through the fluid drain header 40 includes the IPA liquid dissolved from the surface of the wafer W into the supercritical fluid in the supercritical state.

Within this drying unit 18, the IPA liquid between patterns formed on the wafer W is slowly dissolved in the supercritical fluid as it comes into contact with the supercritical fluid of a high-pressure state (e.g., 16 MPa), and the IPA liquid between the patterns is replaced by the supercritical fluid gradually. Finally, gaps between the patterns is filled with only the supercritical fluid.

By decompressing the main body 31 to an atmospheric pressure form the high-pressure state after the IPA liquid between the patterns is removed, $CO_2$ is changed from the supercritical state to a gas state, so that the gaps between the patterns is occupied by only the gas. In this way, the IPA liquid between the patterns is removed, and the drying processing of the wafer W is completed.

Here, the supercritical fluid has a smaller viscosity as compared to a liquid (e.g., the IPA liquid). Further, the supercritical fluid can efficiently dissolve the liquid, and no interface exists between the supercritical fluid and a liquid or a gas in an equilibrium state with the supercritical fluid. Accordingly, in the drying processing with the supercritical fluid, the liquid can be dried without being affected by a surface tension. Therefore, according to the present exemplary embodiment, the pattern collapse can be suppressed during the drying processing.

Further, although the exemplary embodiment has been described for the example where the IPA liquid is used as the liquid for the drying prevention and the $CO_2$ in the supercritical state is used as the processing fluid, a liquid other than the IPA may be used as the liquid for the drying prevention, and a fluid other than the $CO_2$ in the supercritical state can be used as the processing fluid.

<Substrate Processing Flow>

Now, a flow of a processing upon the wafer W in the above-described substrate processing system 1 will be explained with reference to FIG. 5. FIG. 5 is a flowchart showing a sequence of a series of substrate processings performed in the substrate processing system 1 according to the exemplary embodiment. The series of substrate processings shown in FIG. 5 are performed under the control of the controller 61.

In the substrate processing system 1, the transfer device 13 takes out a wafer W from the carrier C and places the taken wafer W on the delivery unit 14 (process S101). Then, in the substrate processing system 1, there is performed a first transfer processing in which the transfer device 16 takes out the wafer W from the delivery unit 14 and transfers the taken wafer W to the liquid processing unit 17 (process S102). In the drawings that follows, this first transfer processing will be referred to as "T1".

Thereafter, in the substrate processing system 1, a first processing (the cleaning processing in the exemplary embodiment) is performed in the liquid processing unit 17 (process S103). The liquid processing unit 17 removes the particle, the natural oxide film, or the like from the top surface of the wafer W by supplying various processing liquids onto the top surface of the wafer W which is the pattern formation surface.

Subsequently, in the substrate processing system 1, the liquid film forming processing is performed in the liquid processing unit 17 (process S104). For example, the liquid processing unit 17 supplies the IPA liquid onto the top surface of the wafer W after being subjected to the cleaning processing, thus forming the liquid film of the IPA liquid on the top surface of the wafer W. In the drawings that follow, the first processing and the liquid film forming processing performed in the liquid processing unit 17 will be together referred to as "SPIN".

Thereafter, in the substrate processing system 1, there is performed a second transfer processing in which the transfer device 16 takes out the wafer W having the liquid film formed thereon from the liquid processing unit 17 and then transfers the taken wafer W into the drying unit 18 (process S105). In the drawings that follow, this second transfer processing will be referred to as "T2".

Then, in the substrate processing system 1, a second processing (the supercritical drying processing in the exemplary embodiment) is performed in the drying unit 18 (process S106). In this supercritical drying processing, the drying unit 18 dries the wafer W after being subjected to the liquid film forming processing by bringing the wafer W after the liquid film forming processing into the supercritical fluid. In the drawings that follow, this second processing will be referred to as "SCC".

Next, in the substrate processing system 1, there is performed a third transfer processing in which the transfer device 16 takes the wafer W after being subjected to the supercritical drying processing from the drying unit 18 and then transfers the taken wafer W to the delivery unit 14 (process S107). Further, in the drawings that follow, this third transfer processing will be referred to as "T3".

Finally, in the substrate processing system 1, the transfer device 13 takes out the wafer W from the delivery unit 14 and then carries the taken wafer W into the carrier C (process S108). Upon the completion of this carry-out processing, the series of substrate processings upon a single wafer W is ended.

Here, in this series of substrate processings, if another wafer W is being transferred by the transfer device 16 at a timing when the second transfer processing of the wafer W after being subjected to the liquid film forming processing is being performed, the wafer W having the liquid film formed thereon needs to stand by until the transfer processing of the another wafer W is completed.

If the state of the liquid film on the surface of the wafer W is changed (for example, the liquid film is dried) during this stand-by period, the problem such as the collapse of the pattern formed on the wafer W may occur in the subsequent supercritical drying processing, resulting in a decrease of a yield of wafers W.

In this regard, according to the exemplary embodiment, a start timing setting processing in which a start timing of the first transfer processing is set in a preset sequence before the first transfer processing of the wafer W is begun. Through this processing, the transfer processing of the another wafer W by the transfer device 16 can be suppressed at the timing when the second transfer processing of the wafer W after being subjected to the liquid film forming processing is performed.

<Detail of Start Timing Setting Processing>

Now, a detail of the start timing setting processing for the first transfer processing will be explained with reference to FIG. 6A to FIG. 11. FIG. 6A to FIG. 11 are timing charts (1) to (6) for describing the start timing setting processing for the first transfer processing according to the exemplary embodiment. Further, the start timing setting processing of the first transfer processing shown in FIG. 6A to FIG. 11 are performed under the control of the controller 61.

Further, the following exemplary embodiment will be described for a case where three pairs of the liquid processing units 17 and the drying units 18 perform the substrate processings subsequently. The first processing and the liquid film forming processing performed in the liquid processing unit 17 of the first pair is defined as "SPIN1", and the supercritical drying processing performed in the drying unit 18 of the first pair is defined as "SCC1".

Likewise, the first processing and the liquid film forming processing performed in the liquid processing unit 17 of the second pair is defined as "SPIN2", and the supercritical drying processing performed in the drying unit 18 of the second pair is defined as "SCC2". Further, the first processing and the liquid film forming processing performed in the liquid processing unit 17 of the third pair is defined as "SPIN3", and the supercritical drying processing performed in the drying unit 18 of the third pair is defined as "SCC3".

As depicted in FIG. 6A, after the first transfer processing T1 of a first sheet of wafer W1 is begun in the substrate processing system 1, the start timing setting processing for the first transfer processing of a second sheet of wafer W2 is performed before the first transfer processing of the wafer W2 is started.

First, the controller 61 sets a timing Ta when the first transfer processing of the wafer W1 transferred immediately before is ended as a start timing of the first transfer processing of the wafer W2. Then, the controller 61 determines whether another wafer W is not being processed in the liquid processing unit 17 (SPIN2) of the second pair where the first processing of the wafer W2 is supposed to be performed.

Here, in the state shown in FIG. 6A, another wafer W is not being processed in the liquid processing unit 17 of the second pair where the first processing of the wafer W2 is scheduled to be performed. Thus, the controller 61 then determines whether a timing when the first transfer processing of the wafer W2 is performed and a timing when another wafer W is transferred are not overlapped.

Here, in the state shown in FIG. 6A, the first transfer processing of the wafer W2 does not overlap with the transfer processing of another wafer W. Thus, the controller 61 then determines whether a timing when the second transfer processing T2 of the wafer W2 is performed and a timing when another wafer W is transferred are not overlapped.

Here, in the state shown in FIG. 6A, the second transfer processing of the wafer W1 is being performed at a start timing Tb of the second transfer processing of the wafer W2. Accordingly, the controller 61 shifts a start timing of the second transfer processing of the wafer W2 to an end timing Tc of the second transfer processing of the wafer W1, as shown in FIG. 6B.

It is because the end timing Tc of the second transfer processing of the wafer W1 is the earliest timing which does not overlap with the transfer processing of another wafer W. As stated above, by shifting the start timing of the second transfer processing to the earliest timing which does not overlap with the transfer processing of another wafer W, an extra standby time is reduced, so that the throughput of the wafers W in the substrate processing system 1 can be improved.

Along with this shift of the second transfer processing, the controller 61 also shifts the start timing of the first transfer processing of the wafer W2 to Td from Ta.

Then, the controller 61 determines whether the new timing when the first transfer processing of the wafer W2 is performed and the timing when another wafer W is transferred are not overlapped. Here, in the state shown in FIG. 6B, another wafer W is not transferred at the timing when the first transfer processing of the wafer W2 is performed.

That is, in the state shown in FIG. 6B, neither of the first transfer processing and the second transfer processing of the wafer W2 are overlapped with the transfer processing of another wafer W. Accordingly, the controller 61 sets the newly set start timing Td as the start timing of the first transfer processing of the wafer W2. Then, the controller 61 starts the first transfer processing of the wafer W2 at the set start timing Td.

Thereafter, as depicted in FIG. 7A, the start timing setting processing for the first transfer processing of a third sheet of wafer W3 is performed before the first transfer processing of this wafer W3 is started.

First, the controller 61 sets a timing Te when the first transfer processing of the wafer W2 transferred immediately before is ended as a start timing of the first transfer processing of the wafer W3. Then, the controller 61 determines whether another wafer W is not being processed in the liquid processing unit 17 (SPIN3) of the third pair in which the first processing of the wafer W3 is supposed to be performed.

Here, in the state shown in FIG. 7A, another wafer W is not being processed in the liquid processing unit 17 of the third pair where the first processing of the wafer W3 is scheduled to be performed. Thus, the controller 61 then determines whether a timing when the first transfer processing of the wafer W3 is performed and a timing when another wafer W is transferred are not overlapped.

Here, in the state shown in FIG. 7A, the first transfer processing of the wafer W3 does not overlap with the transfer processing of another wafer W. Thus, the controller 61 then determines whether a timing when the second transfer processing of the wafer W3 is performed and a timing when another wafer W is transferred are not overlapped.

Here, in the state shown in FIG. 7A, the second transfer processing of the wafer W2 is being performed at a start timing Tf of the second transfer processing of the wafer W3. Accordingly, the controller 61 shifts the start timing of the second transfer processing of the wafer W3 to an end timing Tg of the second transfer processing of the wafer W2, as shown in FIG. 7B.

Along with this shift of the second transfer processing, the controller 61 also shifts the start timing of the first transfer processing of the wafer W3 to Th from Te.

Then, the controller 61 determines whether the new timing when the first transfer processing of the wafer W3 is performed and the timing when another wafer W is transferred are not overlapped. Here, in the state shown in FIG. 7B, another wafer W is not transferred at the timing when the first transfer processing of the wafer W3 is performed.

That is, in the state shown in FIG. 7B, neither of the first transfer processing and the second transfer processing of the wafer W3 are overlapped with the transfer processing of another wafer W. Accordingly, the controller 61 sets the newly set start timing Th as the start timing of the first transfer processing of the wafer W3. Then, the controller 61 starts the first transfer processing of the wafer W3 at the set start timing Th.

Figures 8A, 8B, 8C:
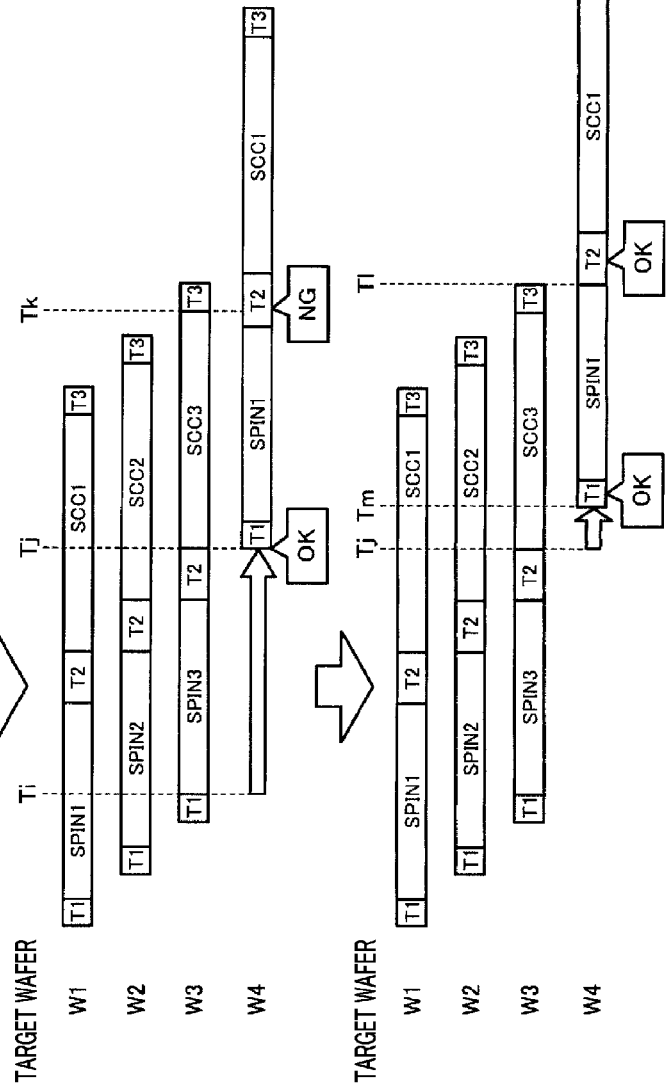
FIG. 8A to FIG. 8C are timing charts (3) for describing the start timing setting processing for the first transfer processing according to the exemplary embodiment.

Subsequently, as depicted in FIG. 8A, the start timing setting processing for the first transfer processing of a fourth sheet of wafer W4 is carried out before the first transfer processing of this wafer W4 is begun.

First, the controller 61 sets a timing Ti when the first transfer processing of the wafer W3 transferred immediately before is ended as a start timing of the first transfer processing of the wafer W4. Then, the controller 61 determines whether another wafer W is being processed in the liquid processing unit 17 (SPIN1) of the first pair in which the first processing of the wafer W4 is supposed to be performed.

Here, in the state shown in FIG. 8A, another wafer W1 is being processed in the liquid processing unit 17 of the first pair where the first processing of the wafer W4 is scheduled to be performed. Thus, the controller 61 shifts the start timing of the first transfer processing of the wafer W4 to an end timing Tj of the second transfer processing of the wafer W3, as shown in FIG. 8B.

It is because the end timing Tj of the second transfer processing of the wafer W3 is the earliest timing which does not overlap with the processing in the liquid processing unit 17 of the first pair and the transfer processing of another wafer W.

As stated above, by shifting the start timing of the first transfer processing to the earliest timing which does not overlap with the processing in the liquid processing unit 17 and the transfer processing of another wafer W, an extra standby time is reduced, so that the throughput of the wafers W in the substrate processing system 1 can be improved.

Then, the controller 61 determines whether a timing when the second transfer processing of the wafer W4 is performed and a timing when another wafer W is transferred are not overlapped.

Here, in the state shown in FIG. 8B, the third transfer processing of the wafer W3 is being performed at a timing Tk within a time period during which the second transfer processing of the wafer W4 is performed. Accordingly, the controller 61 shifts the start timing of the second transfer processing of the wafer W4 to an end timing Tl of the third transfer processing of the wafer W3, as shown in FIG. 8C.

Along with this shift of the second transfer processing, the controller 61 also shifts the start timing of the first transfer processing of the wafer W4 to Tm from Tj.

Then, the controller 61 determines whether the new timing when the first transfer processing of the wafer W4 is performed and the timing when another wafer W is transferred are not overlapped. Here, in the state shown in FIG. 8C, another wafer W is not transferred at the timing when the first transfer processing of the wafer W4 is performed.

That is, in the state shown in FIG. 8C, neither of the first transfer processing and the second transfer processing of the wafer W4 are overlapped with the transfer processing of another wafer W. Accordingly, the controller 61 sets the newly set start timing Tm as the start timing of the first transfer processing of the wafer W4. Then, the controller 61 starts the first transfer processing of the wafer W4 at the set start timing Tm.

Figures 9A, 9B:
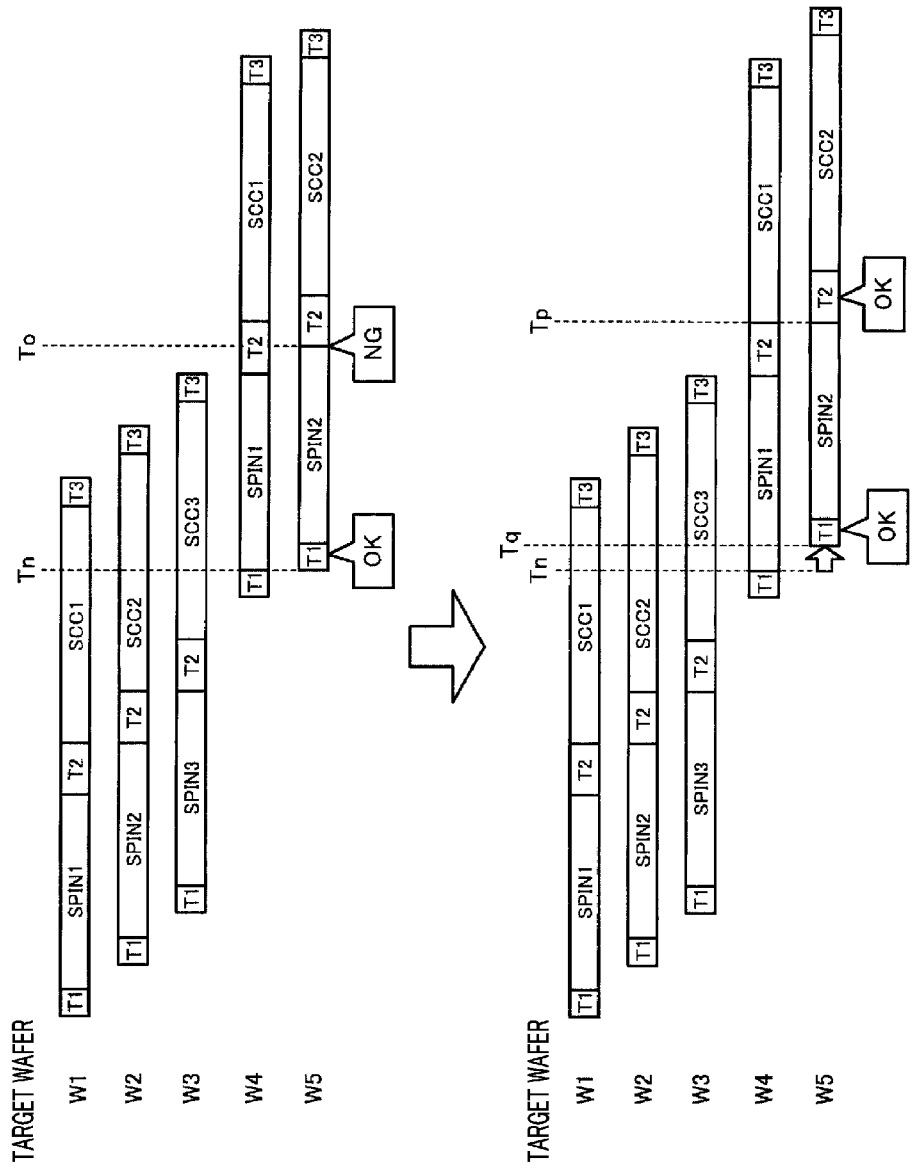
FIG. 9A and FIG. 9B are timing charts (4) for describing the start timing setting processing for the first transfer processing according to the exemplary embodiment.

Subsequently, as depicted in FIG. 9A, the start timing setting processing for the first transfer processing of a fifth sheet of wafer W5 is carried out before the first transfer processing of this wafer W5 is begun.

First, the controller 61 sets a timing Tn when the first transfer processing of the wafer W4 transferred immediately before is ended as a start timing of the first transfer processing of the wafer W5. Then, the controller 61 determines whether another wafer W is being processed in the liquid processing unit 17 of the second pair in which the first processing of the wafer W5 is supposed to be performed.

Here, in the state shown in FIG. 9A, another wafer W is not being processed in the liquid processing unit 17 of the second pair where the first processing of the wafer W5 is scheduled to be performed. Thus, the controller 61 then determines whether a timing when the first transfer processing of the wafer W5 is performed and a timing when another wafer W is transferred are not overlapped.

Here, in the state shown in FIG. 9A, the first transfer processing of the wafer W5 does not overlap with the transfer processing of another wafer W. Thus, the controller 61 then determines whether a timing when the second transfer processing of the wafer W5 is performed and a timing when another wafer W is transferred are not overlapped.

Here, in the state shown in FIG. 9A, the second transfer processing of the wafer W4 is being performed at a start timing To when the second transfer processing of the wafer W5 is performed. Accordingly, the controller 61 shifts the start timing of the second transfer processing of the wafer W5 to an end timing Tp of the second transfer processing of the wafer W4, as shown in FIG. 9B.

Along with this shift of the second transfer processing, the controller 61 also shifts the start timing of the first transfer processing of the wafer W5 to Tq from Tn.

Then, the controller 61 determines whether the new timing when the first transfer processing of the wafer W5 is performed and the timing when another wafer W is transferred are not overlapped. Here, in the state shown in FIG. 9B, another wafer W is not transferred at the timing when the first transfer processing of the wafer W5 is performed.

That is, in the state shown in FIG. 9B, neither of the first transfer processing and the second transfer processing of the wafer W5 are overlapped with the transfer processing of another wafer W. Accordingly, the controller 61 sets the newly set start timing Tq as the start timing of the first transfer processing of the wafer W5. Then, the controller 61 starts the first transfer processing of the wafer W5 at the set start timing Tq.

Figure 10A:
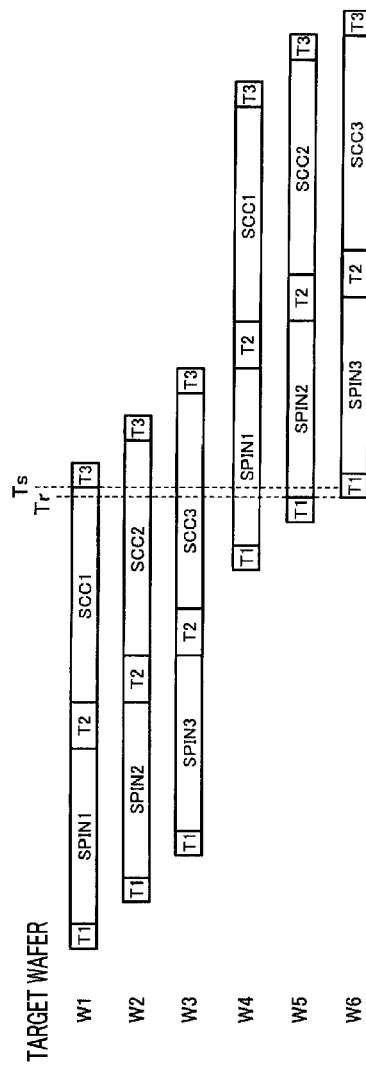
FIG. 10A and FIG. 10B are timing charts (5) for describing the start timing setting processing for the first transfer processing according to the exemplary embodiment.

Subsequently, as depicted in FIG. 10A, the start timing setting processing for the first transfer processing of a sixth sheet of wafer W6 is carried out before the first transfer processing of this wafer W6 is begun.

First, the controller 61 sets a timing Tr when the first transfer processing of the wafer W5 transferred immediately before is ended as a start timing of the first transfer processing of the wafer W6. Then, the controller 61 determines whether another wafer W is being processed in the liquid processing unit 17 of the third pair in which the first processing of the wafer W6 is supposed to be performed.

Here, in the state shown in FIG. 10A, another wafer W is not being processed in the liquid processing unit 17 of the third pair where the first processing of the wafer W6 is scheduled to be performed. Thus, the controller 61 then determines whether a timing when the first transfer processing of the wafer W6 is performed and a timing when another wafer W is transferred are not overlapped.

Here, in the state shown in FIG. 10A, the third transfer processing of the wafer W1 is performed at a timing Ts within a time period during which the first transfer processing of the wafer W6 is performed. Accordingly, the controller 61 shifts the start timing of the first transfer processing of the wafer W6 to an end timing Tt of the second transfer processing of the wafer W5, as shown in FIG. 10B.

It is because the end timing Tt of the second transfer processing of the wafer W5 is the earliest timing which does not overlap with the transfer processing of another wafer W.

Then, the controller 61 determines whether a timing when the second transfer processing of the wafer W6 is performed and a timing when another wafer W is transferred are not overlapped.

Figure 10B:
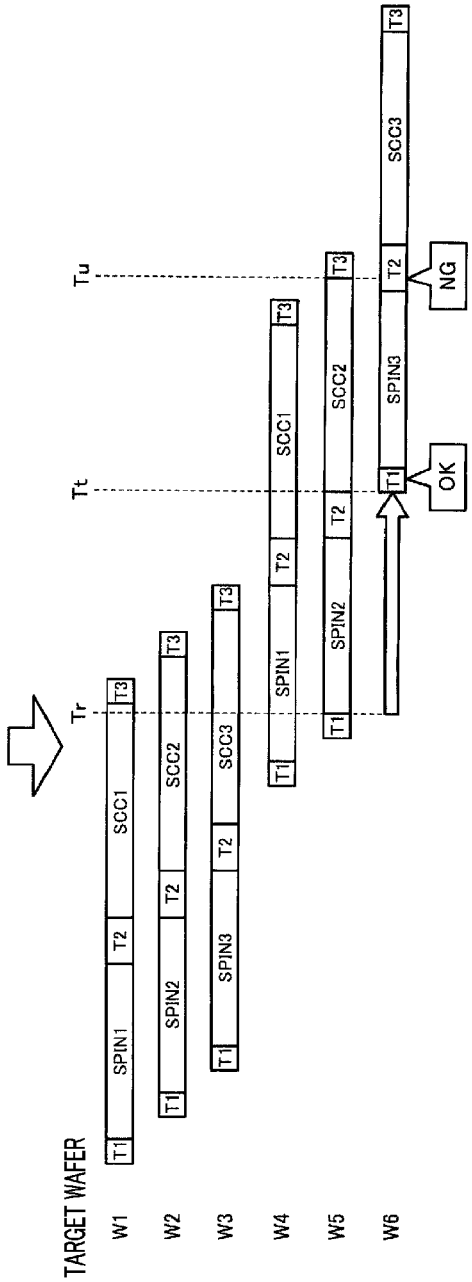

Here, in the state shown in FIG. 10B, the third transfer processing of the wafer W5 is performed at a timing Tu within a time period during which the second transfer processing of the wafer W6 is performed. Accordingly, the controller 61 shifts the start timing of the second transfer processing of the wafer W6 to an end timing Tv of the third transfer processing of the wafer W5, as shown in FIG. 11.

Along with this shift of the second transfer processing, the controller 61 also shifts the start timing of the first transfer processing of the wafer W6 to Tw from Tt.

Then, the controller 61 determines whether the new timing when the first transfer processing of the wafer W6 is performed and the timing when another wafer W is transferred are not overlapped. Here, in the state shown in FIG. 11, another wafer W is not transferred at the timing when the first transfer processing of the wafer W6 is performed.

Figure 11:
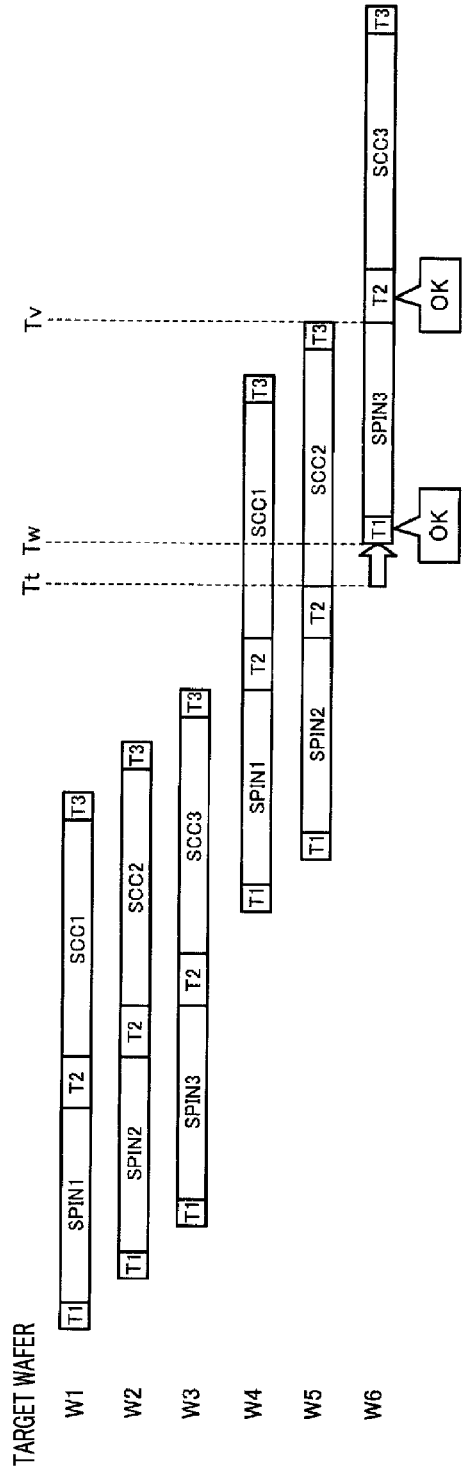
FIG. 11 is a timing chart (6) for describing the start timing setting processing for the first transfer processing according to the exemplary embodiment.

That is, in the state shown in FIG. 11, neither of the first transfer processing and the second transfer processing of the wafer W6 are overlapped with the transfer processing of another wafer W. Accordingly, the controller 61 sets the newly set start timing Tw as the start timing of the first transfer processing of the wafer W6. Then, the controller 61 starts the first transfer processing of the wafer W6 at the set start timing Tw.

By performing the processings described so far, it is possible to suppress the transfer processings of the multiple wafers W from being overlapped when transferring these wafers W between the pairs of the liquid processing units 17 and the drying units 18 and the delivery unit 14 by the common transfer device 16.

That is, it is possible to suppress another wafer W from being transferred by the transfer device 16 at the timing when the second transfer processing of the wafer W after being subjected to the liquid film forming processing is carried out. Thus, according to the exemplary embodiment, non-uniformity in the transfer time can be suppressed when transferring the wafers W each having the liquid film formed on the surface thereof.

<Sequence of Start Timing Setting Processing>

Figure 12:
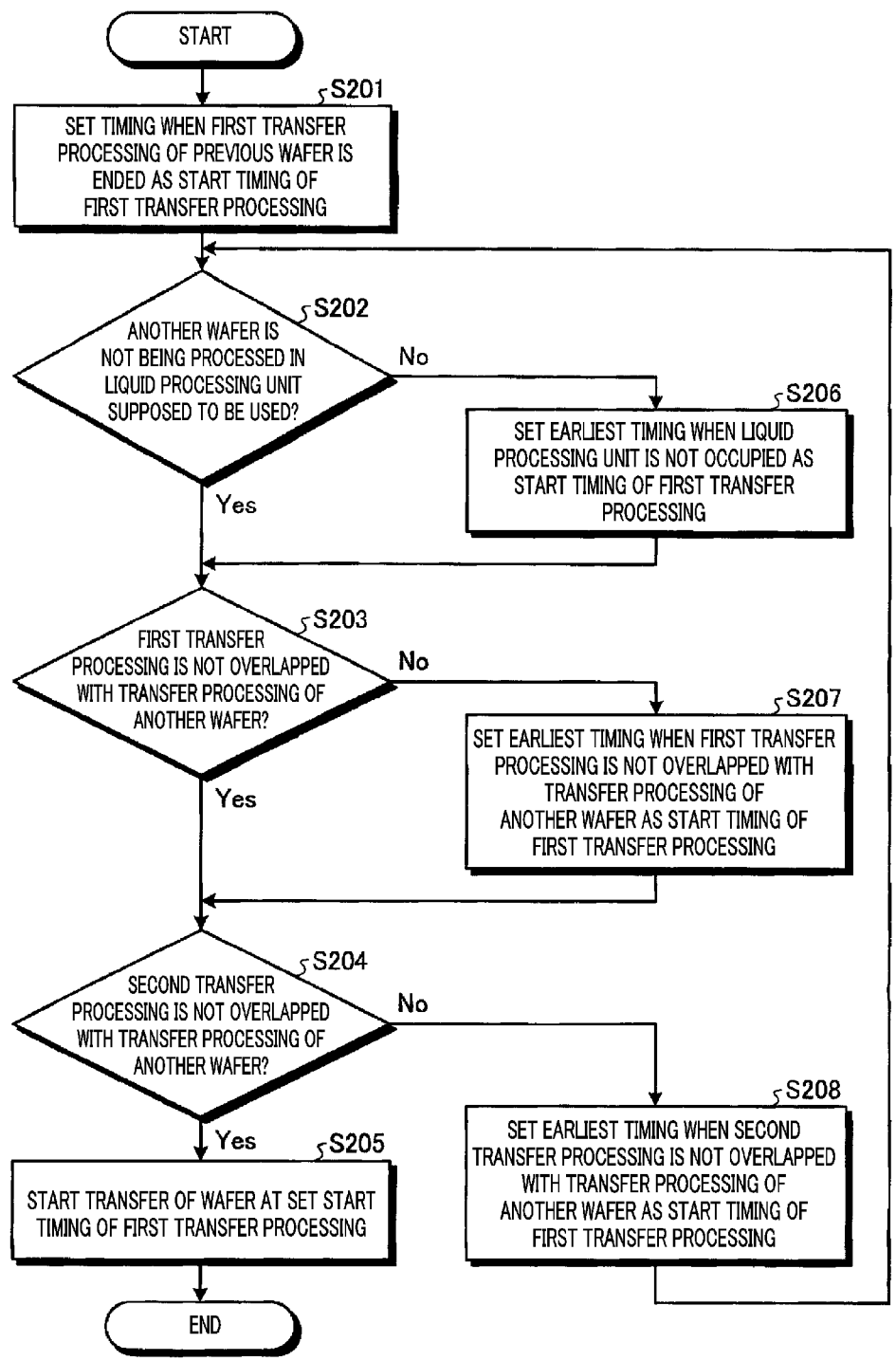
FIG. 12 is a flowchart showing a sequence of the start timing setting processing for the first transfer processing according to the exemplary embodiment.

Now, a sequence of the start timing setting processing for the first transfer processing according to the exemplary embodiment will be explained with reference to FIG. 12. FIG. 12 is a flowchart showing the sequence of the start timing setting processing for the first transfer processing according to the exemplary embodiment.

First, the controller 61 sets a timing when the first transfer processing of a previous wafer W is ended as a start timing of the first transfer processing of a target wafer W (process S201). Then, the controller 61 determines whether another wafer W is not being processed in a target liquid processing unit 17 where the target wafer W is supposed to be processed (process S202).

If another wafer W is not being processed in the target liquid processing unit 17 (process S202, Yes), the controller 61 determines whether the first transfer processing of the target wafer W overlaps with the transfer processing of another wafer W (process S203).

If the first transfer processing of the target wafer W does not overlap with the transfer processing of the another wafer W (process S203, Yes), the controller 61 determines whether the second transfer processing of the target wafer W overlaps with the transfer processing of another wafer W (process S204).

If the second transfer processing of the target wafer W does not overlap with the transfer processing of another wafer W (process S204, Yes), the controller 61 starts the first transfer processing of the target wafer W at the set starting timing of the first transfer processing (process S205). Then, the start timing setting processing for the target wafer W is finished.

Meanwhile, if it is found out in the process S202 that another wafer W is being processed (process S202, No), the controller 61 sets the earliest timing when the target liquid processing unit 17 is not occupied as the start timing of the first transfer processing of the target wafer W (process S206). Then, the processing proceeds to the process S203.

If the first transfer processing is found in the process S203 to be overlapped with the transfer processing of another wafer W (process S203, No), the controller 61 sets the earliest timing when the first transfer processing does not overlap with the transfer processing of another wafer W as the start timing of the first transfer processing (process S207). Then, the processing proceeds to the process S204.

If it is found out in the process S204 that the second transfer processing overlaps with the transfer processing of another wafer W (process S204, No), the controller 61 sets the earliest timing when the second transfer processing does not overlap with the transfer processing of another wafer W as the start timing of the first transfer processing (process S208). Then, the processing returns back to the process S202.

The substrate processing apparatus (substrate processing system 1) according to the exemplary embodiment includes the multiple first processors (liquid processing units 17), the multiple second processors (drying units 18), the transfer module (transfer device 16) and the controller 61. Each of the first processors performs the first processing (cleaning processing) on the substrate (wafer W). Each of the second processors performs the second processing (supercritical drying processing) on the substrate after being subjected to the first processing. The transfer module transfers substrates to the first processors and the second processors. The controller 61 controls the plurality of first processors, the plurality of second processors and the transfer module. The controller 61 controls the start timing of the first transfer processing such that the timing of the second transfer processing does not overlap with the timing when another substrate is transferred by the transfer module. Here, the first transfer processing refers to the processing in which the substrate is transferred to the first processor, and the second transfer processing is the processing in which the substrate having the liquid film formed thereon after being subjected to the first processing is transferred from the first processor to the second processor. Accordingly, when transferring the wafer W having the liquid film formed on the surface thereof, the non-uniformity in the transfer time can be suppressed.

Furthermore, in the substrate processing apparatus according to the exemplary embodiment, the controller 61 sets the earliest timing when both the first transfer processing and the second transfer processing do not overlap with the transfer processing of another substrate by the transfer module as the start timing of the first transfer processing of the substrate. Accordingly, the throughput of the wafers W in the substrate processing system 1 can be improved.

Besides, in the substrate processing apparatus according to the exemplary embodiment, the first processing is the cleaning processing, and the second processing is the drying processing (supercritical drying processing) of drying the substrate (wafer W) having the liquid film formed thereon by bringing the substrate into contact with the supercritical fluid. Accordingly, the collapse of the pattern of the wafer W can be suppressed during the drying processing.

The substrate processing method according to the exemplary embodiment includes the first transfer processing, the second transfer processing and the third transfer processing. In the first transfer processing, the substrate (wafer W) is carried into one of the first processors (liquid processing units 17) configured to perform the first processing (cleaning processing). In the second transfer processing, the substrate is transferred from the corresponding first processor into one of the second processors (drying units 18) configured to perform the second processing (supercritical drying processing). In the third transfer processing, the substrate is taken out from the corresponding second processor. The start timing of the first transfer processing of the substrate is controlled such that the timing when the substrate having the liquid film formed thereon through the first processing is subjected to the second transfer processing does not overlap with the timing when another substrate is transferred. Accordingly, when transferring the wafer W having the liquid film formed on the surface thereof, the non-uniformity in the transfer time can be suppressed.

MODIFICATION EXAMPLES

Figure 13:
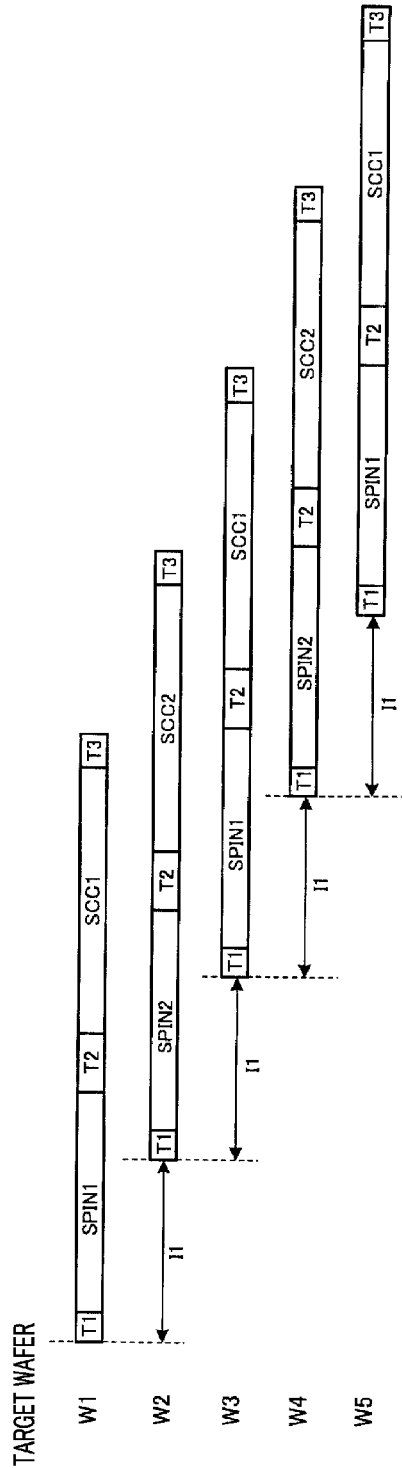
FIG. 13 is a timing chart for describing a sequence of a start timing setting processing for the first transfer processing according to a first modification example of the exemplary embodiment.

Now, various modification examples of the exemplary embodiment will be discussed with reference to FIG. 13 to FIG. 16. FIG. 13 is a timing chart for describing a sequence of a start timing setting processing for a first transfer processing according to a first modification example of the exemplary embodiment. Further, the following various modification examples will be described for cases where two pairs of the liquid processing units 17 and the drying units 18 perform the substrate processing continuously.

As depicted in FIG. 13, if multiple wafers W are processed based on the same processing recipe, the controller 61 calculates a regular interval 11 which allows all the transfer processings of the wafers W being processed not to be overlapped with each other. Then, the controller 61 starts the first transfer processing of the wafers W at this regular interval 11.

By way of example, the controller 61 may calculate the regular interval 11 based on processing times of the first transfer processing, the second transfer processing and the third transfer processing and processing times of the cleaning processing, the liquid film forming processing and the supercritical drying processing in the processing recipe for the wafer W.

Thus, even if the wafers W are processed in a continuous manner to some degree, the transfer processings of the wafers W can be suppressed from being overlapped with each other when transferring the wafers W between the delivery unit 14 and the multiple pairs of the liquid processing units 17 and the drying units 18 by the transfer device 16.

That is, the transfer processing of another wafer W by the transfer device 16 at the timing when the second transfer processing of the wafer W having the liquid film formed thereon is performed can be suppressed. Thus, according to the first modification example, it is possible to suppress the non-uniformity in the transfer time when transferring the wafers W each having the liquid film formed on the surface thereof.

Figures 14A, 14B:
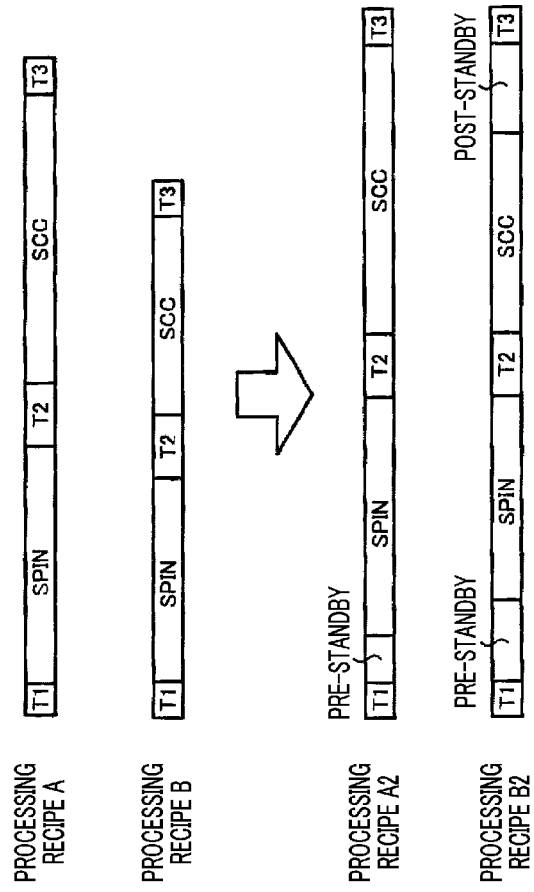
FIG. 14A and FIG. 14B are diagrams for describing a processing of adding a pre-standby processing and a post-standby processing according to a second modification example of the exemplary embodiment.

FIG. 14A and FIG. 14B are diagrams for describing a processing of adding a pre-standby processing and a post-standby processing according to a second modification example of the exemplary embodiment. As shown in FIG. 14A, in case of processing multiple wafers W continuously while using a processing recipe A and a processing recipe B having different processing times, the regular interval 11 as in the first modification example cannot be calculated.

Thus, in the second modification example, as depicted in FIG. 14B, the pre-standby processing and the post-standby processing are added to the processing recipe A and the processing recipe B, respectively. First, a substrate processing having the longest processing time (here, the supercritical drying processing of the processing recipe A) is calculated among all processing recipes to be used (here, the processing recipe A and the processing recipe B).

Then, the pre-standby processing is added to a slot before the cleaning processing and the liquid film forming processing (SPIN) of each processing recipe, and the post-standby processing is added to a slot after the supercritical drying processings SCC of each processing recipe such that each substrate processing has a processing time of the substrate processing having the longest processing time. Accordingly, as shown in FIG. 14B, the processing recipes A and B having the different processing times can be respectively changed to processing recipes A2 and B2 having the substantially same processing time.

Figure 15:
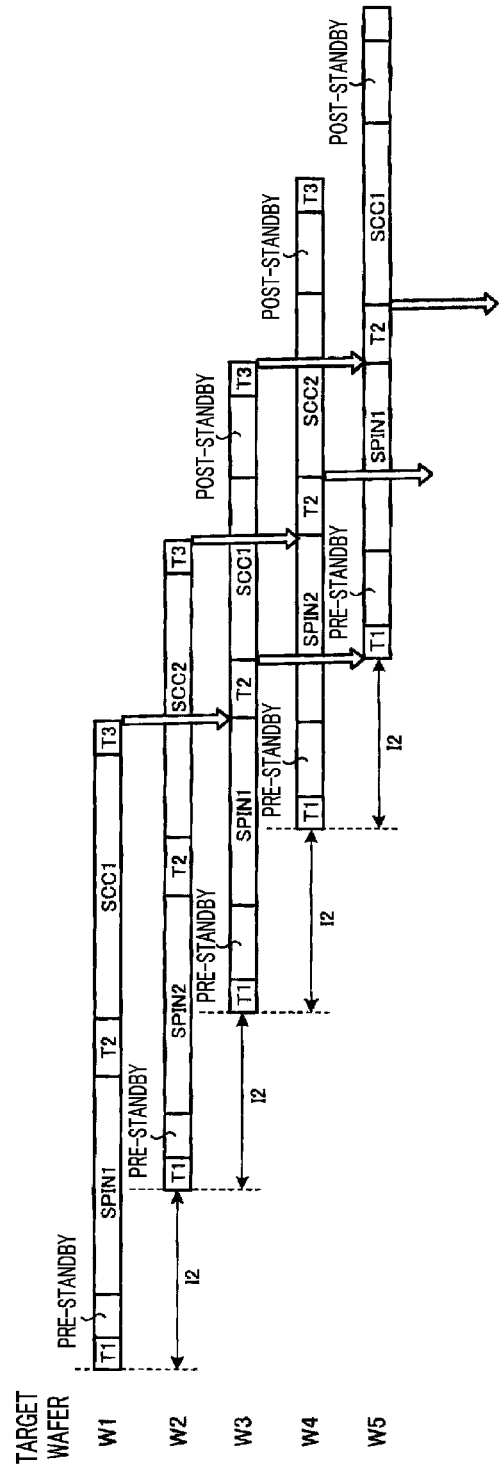
FIG. 15 is a timing chart for describing a sequence of a start timing setting processing for the first transfer processing according to the second modification example of the exemplary embodiment.

Thus, in the second modification example, as shown in FIG. 15, a regular interval 12 which allows the transfer processings of the wafer W being processed not to be overlapped with each other is calculated, as in the first modification example, and the first transfer processings of the wafers W can be begun at this regular interval 12.

Therefore, the transfer of another wafer W by the transfer device 16 at the timing when the second transfer processing of the wafer W having the liquid film formed thereof is performed can be suppressed. Thus, according to the second modification example, it is possible to suppress the non-uniformity in the transfer time when transferring the wafers W each having the liquid film formed on the surface thereof.

Further, even if the pre-standby processing is added to the slot before the cleaning processing and the liquid film forming processing, the wafer W before being subjected to the cleaning processing just stands by within the liquid processing unit 17. Thus, an influence of this pre-standby processing upon the wafer W is small.

Likewise, even if the post-standby processing is added to the slot after the supercritical drying processing, the wafer W after being subjected to the supercritical drying processing just stands by within the drying unit 18. Thus, an influence of this post-standby processing upon the wafer W is small.

In addition, in the second modification example, immediately after the third transfer processing of the target wafer W (here, the wafer W1), the second transfer processing of the wafer W after next (here, the wafer W3) needs to be performed, as shown in FIG. 15. Further, in the second modification example, immediately after the second transfer processing of the wafer W after next (here, the wafer W3), the first transfer processing of another wafer W after next (here, the wafer W5) needs to be performed.

As stated above, by performing the transfer processings of the different wafers W continuously, the extra standby time of the transfer device 16 is reduced. Therefore, the throughput of the wafers W in the substrate processing system 1 can be improved.

Figure 16:
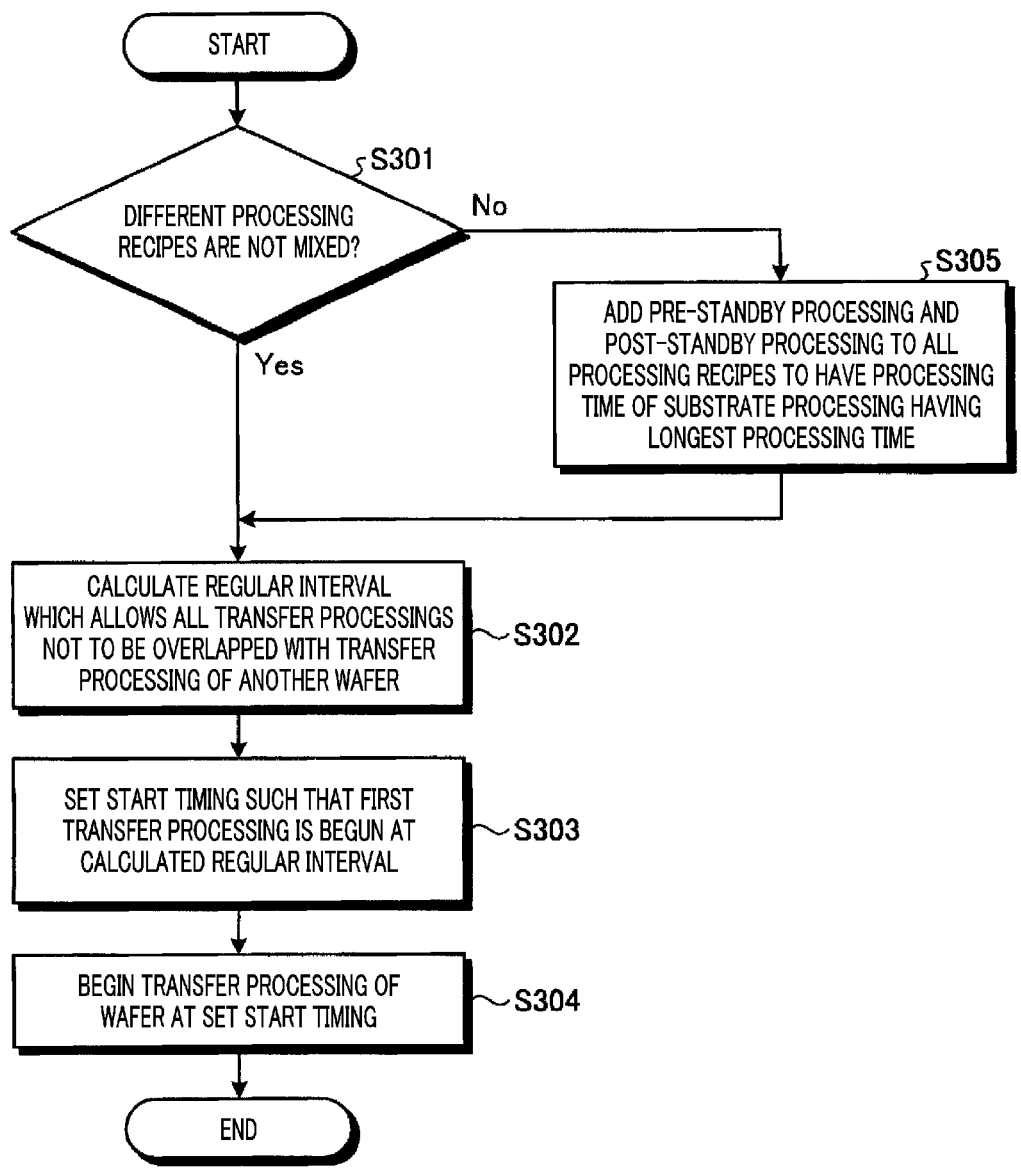
FIG. 16 is a flowchart illustrating a sequence of a start timing setting processing for the first transfer processing according to the first modification example and the second modification example of the exemplary embodiment.

FIG. 16 is a flowchart illustrating a sequence of the start timing setting processing for the first transfer processing according to the first modification example and the second modification example of the exemplary embodiment. First, the controller 61 determines whether different processing recipes are mixed in processing recipes to be performed (process S301).

If the different processing recipes are not mixed (process S301, Yes), the controller 61 calculates a regular interval which allows all transfer processings of the target wafer W not to be overlapped with the transfer processing of another wafer W (process S302).

Then, the controller 61 sets the start timing of the first transfer processing of the wafer W such that the first transfer processing is begun at the calculated regular interval (process S303). Finally, the controller 61 begins the transfer processing of the wafer W at the set start timing (process S304), and ends the processing.

Meanwhile, if it is found out in the process S301 that the different processing recipes are mixed (process S301, No), the controller 61 adds the pre-standby processing and the post-standby processing to all the processing recipes to make the processing times of the processing recipes substantially same based on the processing time of the substrate processing having the longest processing time in the different processing recipes (process S305). Then, the processing proceeds to the process S302.

In the substrate processing apparatus according to the modification examples, the controller 61 calculates the regular interval at which the transfer processings of the substrate (wafer W) do not overlap with the transfer processing of another substrate by the transfer device based on the processing times of all the transfer processings and the processing times of all the substrate processings. Here, all the transfer processings include the first transfer processing, the second transfer processing and the third transfer processing, and all the substrate processings include the first processing (cleaning processing) and the second processing (drying processing). The controller 61 sets the start timing of the first transfer processing of the substrate such that the first transfer processing is begun at the calculated regular interval. Accordingly, even if the wafers W are processed in a continuous manner to some extent, the transfer processings of the multiple wafers W can be suppressed from being overlapped with each other when transferring the multiple wafers W between the delivery unit 14 and the multiple pairs of the liquid processing units 17 and the drying units 18 by the transfer device 16.

Furthermore, in the substrate processing apparatus according to the modification examples, in case that the different processing recipes are previously set for the substrates (wafers W), the controller 61 adds the pre-standby processing to the slot before the first processing to accord to the longest processing time in the multiple first processings and the multiple second processings. Further, the controller 61 adds the post-standby processing to the slot after the second processing. Accordingly, even if the different processing recipes are mixed, the regular interval 12, which allows all the transfer processing of the wafers W being processed not to be overlapped with each other, is calculated, and the first transfer processing of the wafers W can be begun at this regular interval 12.

So far, the exemplary embodiments have been described. However, the exemplary embodiments are not limiting, and various changes and modifications may be made without departing from the inventive scope of the present disclosure. By way of example, although the above-exemplary embodiment has been described for the case where the substrate processing system 1 has the single transfer device 16, the number of the transfer device 16 is not limited thereto, and multiple transfer devices 16 may be provided as long as each transfer device 16 is configured to be shared by the liquid processing unit 17 and the drying unit 18 in each pair.

The exemplary embodiments stated above are not intended to be anyway limiting. The above-described exemplary embodiments may be omitted, replaced and modified in various ways without departing from the scope and the spirit of claims.

According to the exemplary embodiment, it is possible to suppress non-uniformity in a transfer time when transferring wafers each having a liquid film formed on a surface thereof.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A substrate processing apparatus, comprising:
multiple first processors each configured to perform a first processing on a substrate;
multiple second processors each configured to perform a second processing on the substrate on which the first processing is performed;
a transfer module having a wafer holding mechanism configured to transfer the substrate in common to one of the multiple first processors and one of the multiple second processors; and
a controller configured to control the multiple first processors, the multiple second processors and the transfer module,
wherein the controller controls a start timing for a first transfer processing of transferring, by the wafer holding mechanism, the substrate to the first processor such that a timing of a second transfer processing of transferring, by the wafer holding mechanism, the substrate having a liquid film formed thereon through the first processing to the second processor from the first processor, a timing of a third transfer processing of carrying, by the wafer holding mechanism, the substrate out from the second processor, and a timing when another substrate is transferred by the transfer module are not overlapped with each other, and wherein a total processing time from a start of the first transfer processing to an end of the third transfer processing is substantially same for each of the substrate and said another substrate.

2. The substrate processing apparatus of claim 1,
wherein the controller sets an earliest timing when both the first transfer processing and the second transfer processing of the substrate are not overlapped with the timing when the another substrate is transferred by the transfer module as the start timing of the first transfer processing of the substrate.

3. The substrate processing apparatus of claim 2,
wherein the first processing is a cleaning processing, and the second processing is a drying processing of drying the substrate by bringing the substrate having the liquid film formed thereon into contact with a supercritical fluid.

4. The substrate processing apparatus of claim 1,
wherein the controller calculates, based on a processing time of the first transfer processing, a processing time of the first processing, a processing time of the second transfer processing, a processing time of the second processing and a processing time of the third transfer processing of carrying the substrate out from the second processor, a regular interval which allows timings of the first transfer processing, the second transfer processing and the third transfer processing not to be overlapped with the timing when the another substrate is transferred by the transfer module, and the controller sets the start timing of the first transfer processing of the substrate such that the first transfer processing is begun at the calculated regular interval.

5. The substrate processing apparatus of claim 4,
wherein when different processing recipes are previously set for the substrate and said another substrate, respectively, the controller adds a pre-standby processing to a slot before the first processing of all the processing recipes and adds a post-standby processing to a slot after the second processing of all the processing recipes to accord to a longest processing time in the first processings and the second processings.

6. The substrate processing apparatus of claim 5,
wherein the first processing is a cleaning processing, and the second processing is a drying processing of drying the substrate by bringing the substrate having the liquid film formed thereon into contact with a supercritical fluid.

7. The substrate processing apparatus of claim 4,
wherein the first processing is a cleaning processing, and the second processing is a drying processing of drying the substrate by bringing the substrate having the liquid film formed thereon into contact with a supercritical fluid.

8. The substrate processing apparatus of claim 1,
wherein the first processing is a cleaning processing, and the second processing is a drying processing of drying the substrate by bringing the substrate having the liquid film formed thereon into contact with a supercritical fluid.

* * * * *